United States Patent
Zhang

(10) Patent No.: US 10,012,701 B2
(45) Date of Patent: Jul. 3, 2018

(54) ACCURATE ESTIMATION OF THE CAPACITY AND STATE OF CHARGE OF AN ENERGY STORAGE SYSTEM USED IN WIND FARMS

(75) Inventor: Jianhui Zhang, Round Rock, TX (US)

(73) Assignee: VESTAS WIND SYSTEMS A/S, Aarhus N (DK)

(*) Notice: Subject to any disclaimer, the term of this patent is extended or adjusted under 35 U.S.C. 154(b) by 0 days.

(21) Appl. No.: 13/048,599

(22) Filed: Mar. 15, 2011

(65) Prior Publication Data

US 2012/0235409 A1 Sep. 20, 2012

(51) Int. Cl.
*H02J 7/00* (2006.01)
*G01R 31/36* (2006.01)

(52) U.S. Cl.
CPC ..... *G01R 31/3679* (2013.01); *G01R 31/3662* (2013.01)

(58) Field of Classification Search
USPC ........ 320/101, 132, 133; 324/427, 429, 430; 3/101, 132, 133
See application file for complete search history.

(56) References Cited

U.S. PATENT DOCUMENTS

| | | | |
|---|---|---|---|
| 5,225,712 A * | 7/1993 | Erdman | ........................ 290/44 |
| 5,370,711 A | 12/1994 | Audit et al. | |
| 5,439,488 A | 8/1995 | Audit et al. | |
| 5,852,353 A | 12/1998 | Kochanneck | |

(Continued)

FOREIGN PATENT DOCUMENTS

| | | |
|---|---|---|
| EP | 2026404 A1 | 2/2009 |
| EP | 2128439 A1 | 12/2009 |

(Continued)

OTHER PUBLICATIONS

Kim et al., "Energy Harvesting Strategy Using Piezoelectric Element Driven by Vibration Method," Wireless Sensor Network, Feb. 2010, vol. 2: pp. 100-107, <http://www.scirp.org/Journal/PaperInformation.aspx?paperID=1376>.

(Continued)

*Primary Examiner* — Samuel Berhanu
(74) *Attorney, Agent, or Firm* — Patterson + Sheridan, LLP

(57) ABSTRACT

Embodiments of the invention provide techniques and apparatus for accurately estimating an aged capacity ($E_{aged}$) of a battery in an energy storage system (ESS) used on a wind farm. $E_{aged}$ throughout the life of the battery may be estimated by measuring the internal impedance of the battery and using a relationship between the age of the battery (e.g., a number of charging cycles) and a maximum capacity corresponding to the battery. The state of charge (SOC) may be calculated based on the electromotive force (EMF) of the battery. The actual available energy ($E_{available}$) of the battery may be calculated based on the $E_{aged}$ of the battery and the calculated SOC. In this manner, embodiments of the present invention may allow a wind farm to function as a virtual power plant (VPP) and deliver peak load electricity, regardless of intermittent wind velocity.

19 Claims, 5 Drawing Sheets

(56) References Cited

U.S. PATENT DOCUMENTS

| | | |
|---|---|---|
| 5,900,330 A | 5/1999 | Kagatani |
| 6,160,336 A | 12/2000 | Baker, Jr. et al. |
| 6,191,556 B1 | 2/2001 | Galbraith et al. |
| 6,211,643 B1 | 4/2001 | Kagatani |
| 6,459,231 B1 | 10/2002 | Kagatani |
| 6,952,058 B2 | 10/2005 | McCoin |
| 7,075,189 B2 | 7/2006 | Heronemus et al. |
| 7,098,552 B2 | 8/2006 | McCoin |
| 7,116,006 B2 | 10/2006 | McCoin |
| 7,329,099 B2 | 2/2008 | Hartman |
| 7,353,083 B2 | 4/2008 | Hennessy |
| 7,476,987 B2 | 1/2009 | Chang |
| 7,484,561 B2 | 2/2009 | Bridges |
| 7,566,981 B2 | 7/2009 | Kunkel et al. |
| 7,608,937 B1* | 10/2009 | Altenschulte ............ H02J 7/34 290/44 |
| 2003/0099121 A1 | 5/2003 | Yang |
| 2003/0117143 A1 | 6/2003 | Okada |
| 2003/0184307 A1* | 10/2003 | Kozlowski et al. .......... 324/427 |
| 2004/0128089 A1 | 7/2004 | Barsoukov et al. |
| 2004/0222768 A1* | 11/2004 | Moore et al. ................. 320/128 |
| 2007/0159137 A1* | 7/2007 | Verbrugge et al. .......... 320/132 |
| 2007/0252601 A1* | 11/2007 | Satoh et al. ................. 324/431 |
| 2008/0008588 A1 | 1/2008 | Hartman |
| 2008/0022683 A1 | 1/2008 | Ohler et al. |
| 2008/0197801 A1* | 8/2008 | Manor ................. H02J 7/0054 320/103 |
| 2008/0211460 A1* | 9/2008 | Tarng et al. .................. 320/161 |
| 2008/0217998 A1 | 9/2008 | Parmley |
| 2008/0262560 A1* | 10/2008 | Eriksson ......................... 607/29 |
| 2009/0079161 A1* | 3/2009 | Muchow ................ F03D 13/10 280/400 |
| 2009/0141447 A1 | 6/2009 | Soma et al. |
| 2011/0037475 A1 | 2/2011 | Ho |

FOREIGN PATENT DOCUMENTS

| | | |
|---|---|---|
| JP | 2004120881 | 4/2004 |
| WO | 9311604 A1 | 6/1993 |
| WO | 03076800 A2 | 9/2003 |
| WO | 2005081885 A2 | 9/2005 |
| WO | 2005088122 A1 | 9/2005 |
| WO | 2006088509 A2 | 8/2006 |
| WO | 2007132303 A1 | 11/2007 |
| WO | 2008030268 A2 | 3/2008 |
| WO | 2008095315 A1 | 8/2008 |
| WO | 2009131459 A2 | 10/2009 |

OTHER PUBLICATIONS

International Search Report and Written Opinion of the ISA dated Jul. 11, 2012—International Application No. PCT/DK2012/050070.
Pop, V. et al., State-of-Charge Indication in Portable Applications, International Symposium on Industrial Electronics, Jun. 2005, pp. 1007-1012, vol. 3, IEEE, New York, United States.

* cited by examiner

ACCURATE ESTIMATION OF THE CAPACITY AND STATE OF CHARGE OF AN ENERGY STORAGE SYSTEM USED IN WIND FARMS

BACKGROUND OF THE INVENTION

Field of the Invention

Embodiments of the invention generally relate to wind farm energy storage systems, and, more particularly, to accurately estimating an aged capacity of a battery in an energy storage system.

Description of the Related Art

As fossil fuels are being depleted, means for converting alternative energy sources are being researched and developed for more efficient ways to harness the power of the sun, flowing water, and the wind. Wind farms employing numerous wind turbine generators for converting wind energy to electrical energy are being located in areas of the world with consistent wind. As the wind fluctuates, some form of energy storage is typically utilized so that wind farms may provide sufficient energy during calm wind periods.

Some wind farms may comprise an energy storage system (ESS) for storing energy converted by the wind turbine generators and releasing this stored energy to supply electricity demands during lulls in the wind. Accurate estimation of the capacity of and the available energy stored in an ESS may be important to energy storage applications for wind energy. Knowledge of the ESS capacity may be utilized to control the amount of energy charged into the ESS. Knowledge of the available energy stored in the ESS may be employed while dispatching energy from the ESS.

SUMMARY OF THE INVENTION

Embodiments of the invention generally relate to methods and apparatus for accurately estimating an aged capacity of a battery in an energy storage system (ESS) associated with a plurality of wind turbine generators.

One embodiment of the present invention provides a method for estimating an aged capacity of a battery in an ESS associated with a plurality of wind turbine generators. The method generally includes determining an internal impedance of the battery, determining a relationship between a maximum capacity corresponding to the battery and a number of charging cycles, and determining the aged capacity of the battery based on the internal impedance and the relationship.

Another embodiment of the present invention provides an apparatus for estimating an aged capacity of a battery in an ESS associated with a plurality of wind turbine generators. The apparatus generally includes at least one processor configured to determine an internal impedance of the battery, determine a relationship between a maximum capacity corresponding to the battery and a number of charging cycles, and determine the aged capacity of the battery based on the internal impedance and the relationship.

Yet another embodiment of the present invention provides a system. The system generally includes one or more wind turbine generators, at least one battery for storing energy produced by the wind turbine generators and at least one processor. The processor is typically configured to determine an internal impedance of the battery, determine a relationship between a maximum capacity corresponding to the battery and a number of charging cycles, and determine an aged capacity of the battery based on the internal impedance and the relationship.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention provide techniques and apparatus for accurately estimating an aged capacity ($E_{aged}$) of a battery in an energy storage system (ESS) used on a wind farm. $E_{aged}$ throughout the life of the battery may be estimated by measuring the internal impedance of the battery and using a relationship between the age of the battery (e.g., a number of charging cycles) and a maximum capacity corresponding to the battery. The state of charge (SOC) may be calculated based on the electromotive force (EMF) of the battery. The actual available energy ($E_{available}$) of the battery may be calculated based on the $E_{aged}$ of the battery and the calculated SOC. In this manner, embodiments of the present invention may allow a wind farm to function as a virtual power plant (VPP) and deliver peak load electricity, regardless of intermittent wind velocity.

An Example Wind Farm System

Figure 1:
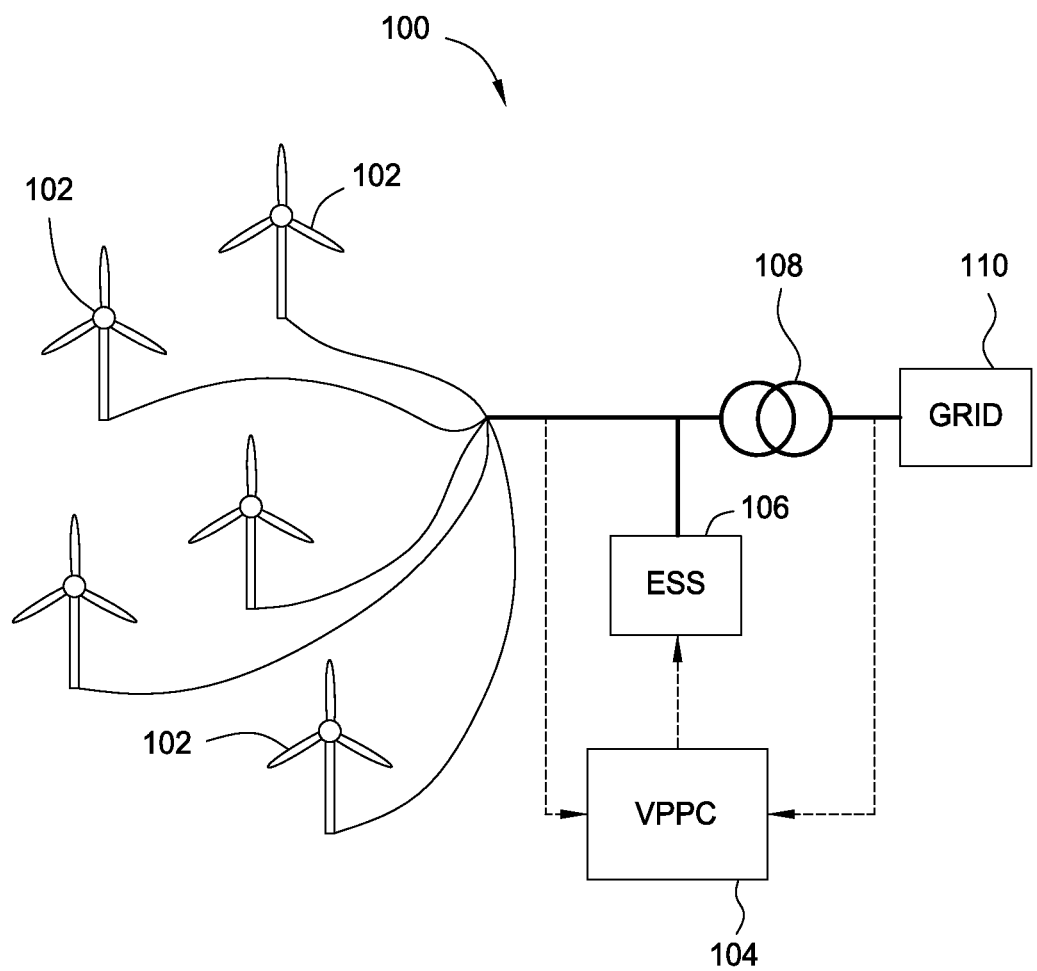
FIG. 1 illustrates an exemplary wind farm system, according to an embodiment of the invention.

FIG. 1 illustrates an exemplary wind farm (WF) system 100. System 100 may comprise a plurality of wind turbine generators 102 for converting wind energy into electrical energy. The plurality of wind turbine generators 102 may be coupled to an electrical power grid 110 via a transformer 108, such as a stepped-up transformer, to provide bulk power to the grid 110. Sensor and other data signals from— as well as control signals to—the wind turbine generators 102 may be transmitted wirelessly or via wires, cables, or any other suitable wired connections between a control station, such as a virtual power plant controller (VPPC) 104, and the wind turbine generators 102 and between the VPPC 104 and the electrical grid 110. The VPPC 104 is typically located on or near the corresponding wind farm.

The VPPC 104 may be coupled to an ESS 106, typically comprising one or more batteries or other electrochemical storage devices. The ESS 106 may allow the wind farm system 100 to provide sufficient power output, especially during periods lacking wind, without sufficient wind velocity, or with sporadic wind. In order to overcome some of the disadvantages of wind farms, such as fluctuating power output, the ESS 106 may be considered part of the wind farm system 100. ESS 106 may allow wind farm system 100 to function as a VPP and deliver peak load electricity regardless of intermittent wind velocity.

Figure 2:
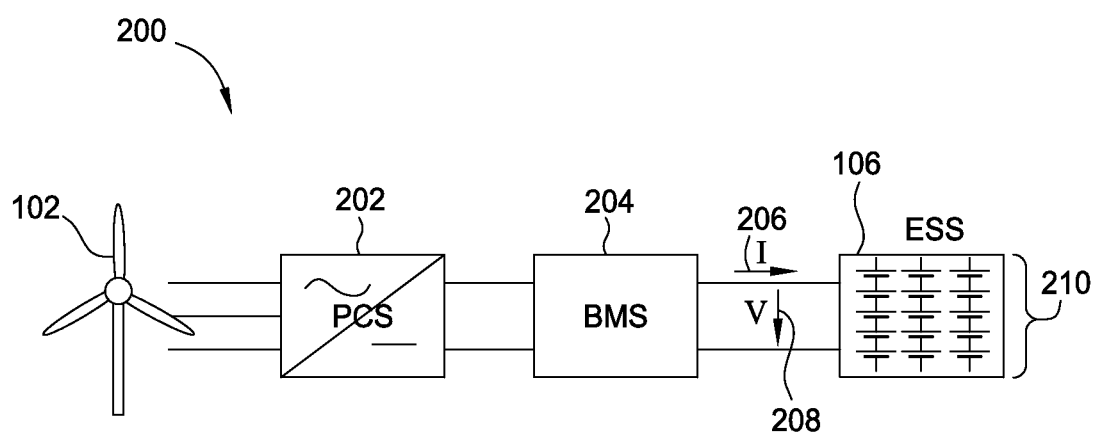
FIG. 2 illustrates an exemplary energy storage system (ESS) charging system, according to an embodiment of the invention.

FIG. 2 illustrates an exemplary ESS charging system 200, which may be incorporated into wind farm system 100 of FIG. 1. Wind turbine generator 102 converts wind energy into mechanical energy through the rotation of the rotor blades and further converts the mechanical energy into electrical energy via a generator coupled to a rotating shaft inside the nacelle. Fluctuations in the wind may cause the rotor of wind turbine generator 102 to spin at variable speeds, which may result in variation of power output from wind turbine 102 to the electrical grid 110. A power conversion system (PCS) 202, which may comprise a rectifying circuit, may be used to convert this generated power from alternating current (AC) electricity to direct current (DC) electricity.

A battery management system (BMS) 204 may be used to charge/discharge the ESS 106, which may comprise a plurality of batteries in series and in parallel as illustrated in FIG. 2. For ease of description, the ESS 106 will be considered henceforth as comprising a single battery 210, capable of relatively higher voltages and higher currents than a typical battery. The BMS 204 may be controlled and monitored by the VPPC 104. Voltage (V) 208 between terminals of the battery 210 and current (I) 206 into the battery 210 may be monitored during ESS operation.

Control of a VPP, including wind turbine generators 102 and ESS 106, may be a challenge. Accurately estimating the available energy ($E_{available}$) stored in the ESS and the maximum energy ($E_{max}$) which the ESS may store may improve control of a VPP.

The state of charge (SOC) is an important parameter of the battery 210. SOC may be defined as the available capacity left in a battery expressed as a percentage of the maximum capacity of the battery as expressed in equation (1):

$$SOC = \frac{E_{available}}{E_{max}} \quad (1)$$

SOC may be used to determine the available energy in the battery according to equation (2):

$$E_{available} = SOC \cdot E_{max} \quad (2)$$

The SOC value may be determined by a battery management system (BMS), which may be provided by battery manufacturers. For some embodiments, the SOC may be determined based on the electromotive force (EMF) of the battery 210 according to a predetermined relationship between SOC and the battery EMF (i.e., the battery voltage). Alternatively, the SOC may be determined by integration of the current 206 through the battery. In determining the SOC, it may be assumed that the capacity of the battery is known and remains constant.

However, $E_{max}$ may gradually decrease as the battery ages. For example, towards the end of the battery's life, the actual capacity of the battery may approach only 80% of the battery's initial capacity.

With decreased capacity as the battery ages, the battery's voltage may still charge to a rated value, which may produce a SOC value of 100%. In this case, the $E_{available}$ may only be 80% of its expected capacity. Usually, a manufacturer does not calculate $E_{available}$. The difference between the expected available energy and the actual $E_{available}$ may have significance for some ESS applications in wind farms.

Accordingly, what is needed are techniques and apparatus for accurately estimating the actual $E_{available}$ of a battery in an ESS. Embodiments of the present invention employ a method to estimate the actual $E_{available}$ by estimating an aged capacity ($E_{aged}$) and SOC of the battery using a combination of measurements and mathematical calculations.

Estimation of $E_{aged}$ and SOC

Figure 3:
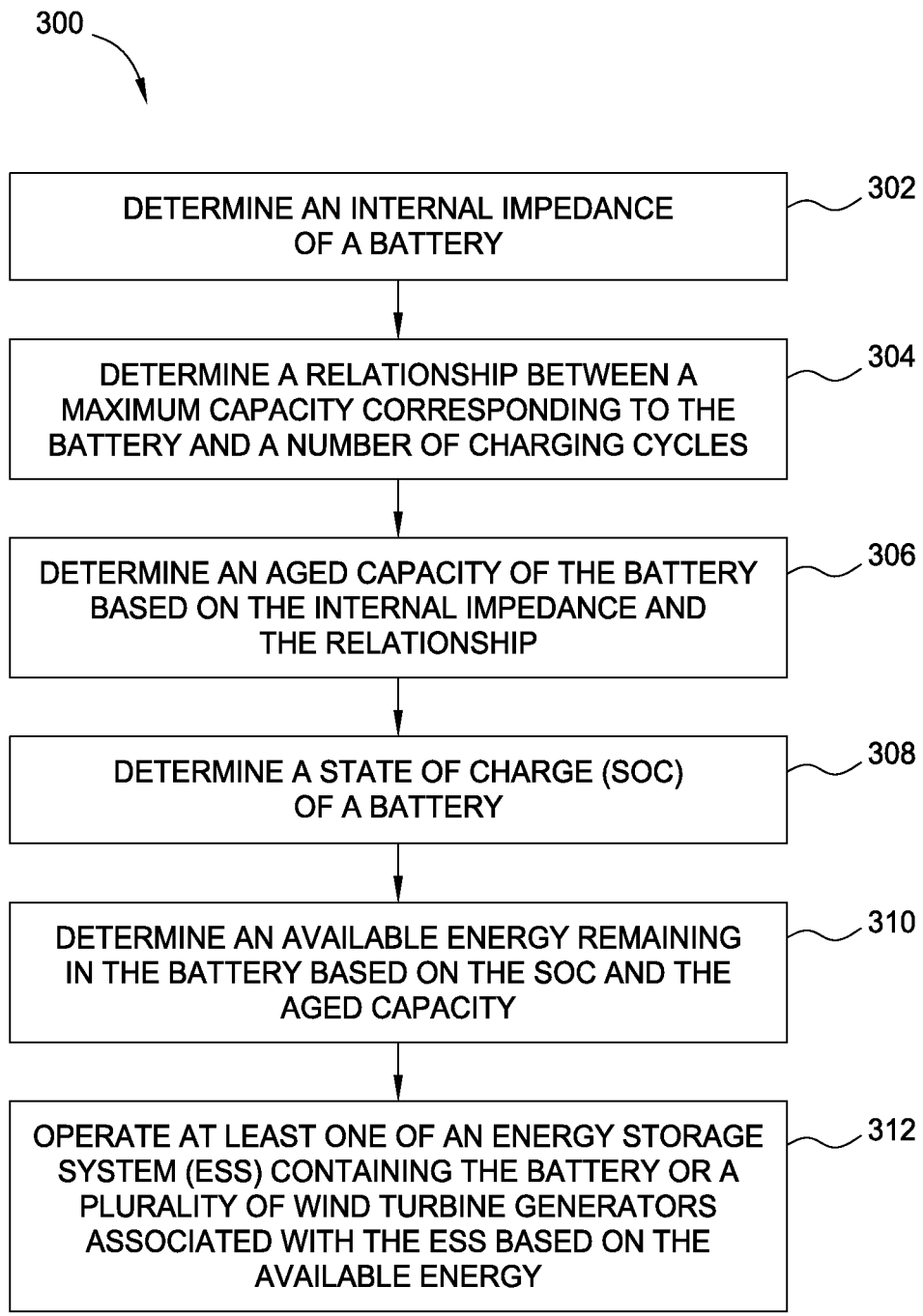
FIG. 3 is a flow diagram of exemplary operations for estimating an aged capacity ($E_{aged}$), a state of charge (SOC), and an available energy ($E_{available}$) remaining in a battery, according to an embodiment of the invention.

FIG. 3 is a flow diagram of exemplary operations 300 for determining $E_{aged}$ and SOC of a battery, such as the battery 210. The operations 300 may begin at 302 by determining an internal impedance of the battery. For some embodiments, the internal impedance may be determined by measuring the voltage 208 across the ESS (i.e., the voltage between the terminals of the battery 210) and the current 206. Internal resistance ($R_{in}$) and the electromotive force (EMF) of the battery 210 may be estimated online using a voltage 208 across the battery 210 and a current 206 through the battery, measured at two different points in time such that a dynamic load is varied. In this manner, two different equations may be solved for the two unknowns (i.e., $R_{in}$ and the EMF) without disconnecting the battery 210 from the load.

Figure 4:
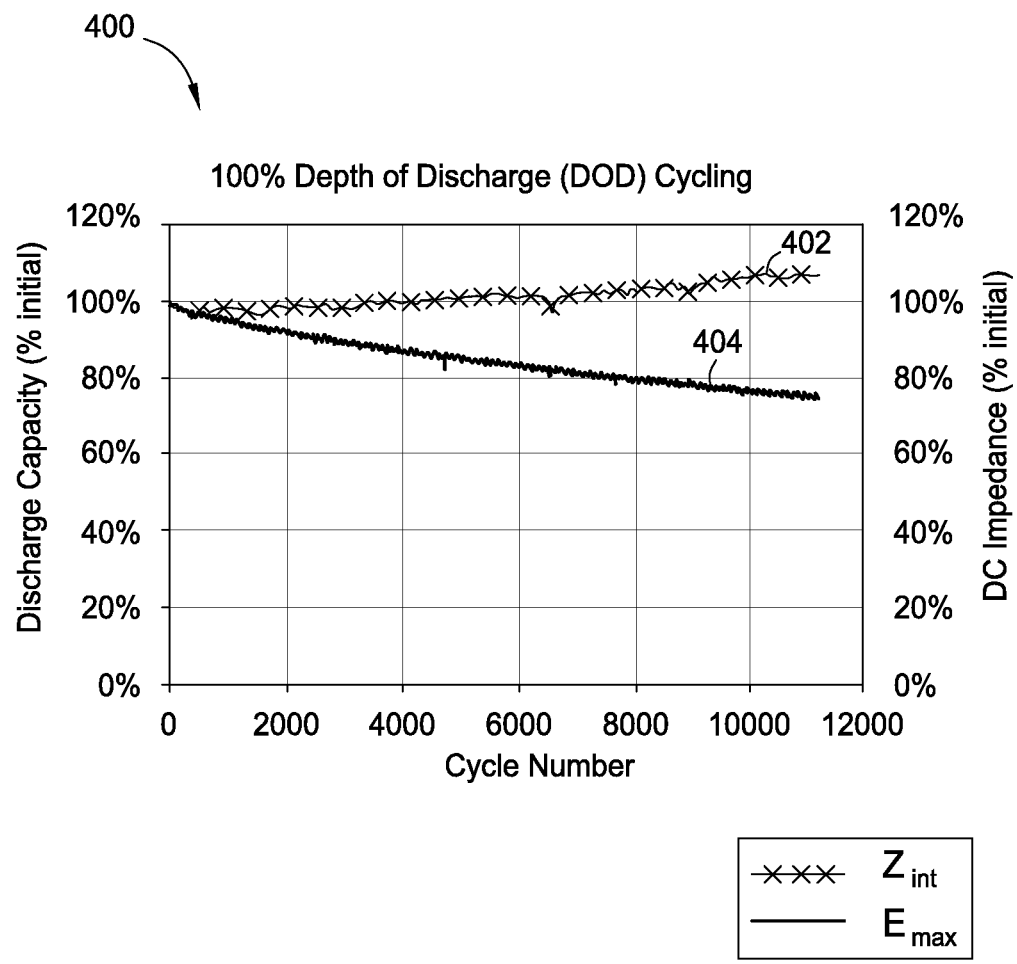
FIG. 4 illustrates a graph of internal impedance and battery capacity corresponding to a number of charging cycles, according to an embodiment of the invention.

FIG. 4 illustrates a graph 400 of the internal impedance 402 and discharge capacity 404 of a battery corresponding to a number of charging cycles, both expressed as a percentage of initial value. Determining $E_{aged}$ for the ESS in running wind farms may be difficult since this determination typically includes fully charging the battery, followed by fully discharging the battery, and then measuring the discharging current and the corresponding time. In contrast, for some embodiments of the invention, the degradation of the battery's capacity may be determined by measuring the variation of the battery's internal impedance. The measured internal impedance 402 may increase as the battery ages, as depicted in FIG. 4.

Returning to FIG. 3, a relationship may be determined at 304 between a maximum capacity corresponding to the battery and a number of charging cycles. Determining the relationship may comprise performing a regression analysis of the maximum capacity corresponding to the battery and a number of charging cycles. The degradation of the battery's capacity may be determined by regression analysis of lab test results on the capacity fade effects. FIG. 4 illustrates exemplary results of the regression analysis on the discharge capacity 404, showing the capacity fade effects where the capacity typically decreases as the battery ages. The regression analysis may be based on maximum capacity data for another battery having functional characteristics similar to the battery, or on the same type of battery.

At 306, an $E_{aged}$ of the battery may be determined based on the measured internal impedance and the relationship between maximum capacity corresponding to the battery and a number of charging cycles. For some embodiments, the measurement of the internal impedance may be used to determine the approximate age of the battery. The age may be expressed as a number of cycles, as shown in the graph 400 of FIG. 4. The age of the battery may then be used to determine a maximum capacity of the battery at that particular age, which yields the aged capacity ($E_{aged}$).

At 308, a SOC of the battery may be determined. Determining the SOC of the battery may comprise determining an electromotive force (EMF) of the battery 210. Determining the EMF of the battery 210 may comprise estimating the EMF by measuring the voltage across the battery 210 and the current into the battery 210 at two different instances, as described above.

At 310, an $E_{available}$ remaining in the battery based on the SOC and the $E_{aged}$ may be determined. In some embodiments, this may involve calculating $E_{available} = SOC \cdot E_{aged}$ according to equation (2) above where $E_{aged}$, in ampere-hour (Ah), is the maximum capacity of the aged battery.

At 312, at least one of an ESS containing the battery or a plurality of wind turbine generators associated with the ESS may be operated based on the $E_{available}$. For example, the blades of the wind turbine generators may be adjusted to turn more quickly and charge the one or more batteries of the ESS more rapidly based on a low $E_{available}$.

Figure 5:
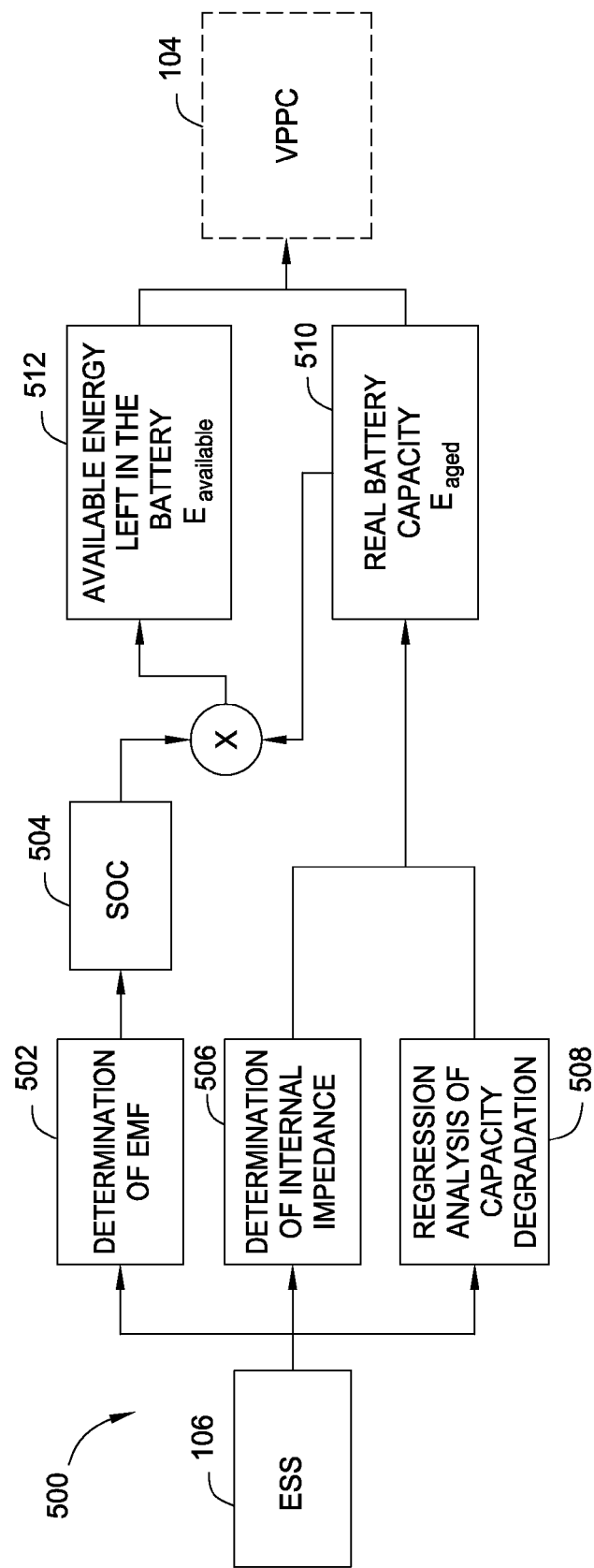
FIG. 5 illustrates an exemplary estimation process to estimate $E_{available}$, according to an embodiment of the invention.

In this manner, $E_{available}$ remaining in the battery, which may be important for a discharging process, and $E_{aged}$ that may be stored in the battery, which may be important for a charging process, may be accurately estimated. The results may be used to improve control strategies for wind farms and ESSs FIG. 5 illustrates an example estimation process 500 to estimate $E_{available}$. Determination of the EMF 502 may be used to calculate the SOC 504 of a battery in the ESS 106. Determination of the internal impedance 506 and regression analysis of capacity degradation 508 may be used to calculate $E_{aged}$ 510 as described above. SOC 504 and $E_{aged}$ 510 may be used to accurately estimate $E_{available}$ 512. $E_{aged}$ 510 and $E_{available}$ 512 may be used by a VPPC 104 to adjust charging or discharging of the ESS 106. The results of the estimation process 500 may be used for improving control strategies of wind farms and, more particularly, of ESSs and wind turbine generators, and for energy dispatching and power flow control.

While the foregoing is directed to embodiments of the present invention, other and further embodiments of the invention may be devised without departing from the basic scope thereof, and the scope thereof is determined by the claims that follow.

What is claimed is:

1. A method for estimating an aged capacity of a battery in an energy storage system (ESS) associated with a plurality of wind turbine generators, the method comprising:
   determining an internal impedance and an electromotive force (EMF) of the battery, wherein the determined internal impedance and the determined EMF are derived from a measured voltage of the battery and a measured current into the battery at two different points in time;
   determining an approximate age of the battery based on the internal impedance;
   determining a relationship between a maximum capacity corresponding to the battery and a number of charging cycles;
   determining the aged capacity of the battery based on the approximate age and the relationship;
   determining a state of charge (SOC) of the battery based on the determined EMF of the battery;
   after determining the aged capacity, measuring an available energy remaining in the battery based on the SOC and the aged capacity; and
   upon determining the available energy remaining in the battery is below a predetermined value, increasing power output of the plurality of wind turbine generators by operating the plurality of wind turbine generators to produce additional power output in order to increase a rate at which the battery is charged.

2. The method of claim 1, wherein determining the relationship comprises performing a regression analysis of the maximum capacity corresponding to the battery.

3. The method of claim 2, wherein the regression analysis is based on maximum capacity data for another battery having functional characteristics similar to the battery.

4. The method of claim 1, wherein a load of the battery varies at the two different points in time.

5. The method of claim 1, wherein operating the plurality of wind turbine generators comprises pitching at least one blade of each of the plurality of wind turbine generators.

6. The method of claim 1, further comprising upon determining the plurality of wind turbine generators are not producing sufficient power output, operating the ESS to discharge the battery.

7. The method of claim 1, wherein upon determining the available energy remaining in the battery is below the aged capacity of the battery, operating the ESS to charge the battery.

8. An apparatus for estimating an aged capacity of a battery in an energy storage system (ESS) associated with a plurality of wind turbine generators, the apparatus comprising:
   at least one processor configured to:
      determine an internal impedance and an electromotive force (EMF) of the battery, wherein the determined internal impedance and the determined EMF are derived from a measured voltage of the battery and a measured current into the battery at two different instances in time;
      determine an approximate age of the battery based on the internal impedance;
      determine a relationship between a maximum capacity corresponding to the battery and a number of charging cycles;
      determine the aged capacity of the battery based on the approximate age and the relationship;
      determine a state of charge (SOC) of the battery based on the determined EMF of the battery;
      after determining the aged capacity, measuring an available energy remaining in the battery based on the SOC and the aged capacity; and
      upon determining the available energy remaining in the battery is below a predetermined value, increase power output of the plurality of wind turbine generators by operating the plurality of wind turbine generators to produce additional power output in order to improve a rate at which the battery is charged.

9. The apparatus of claim 8, wherein the relationship is based on a regression analysis of the maximum capacity corresponding to the battery.

10. The apparatus of claim 9, wherein the regression analysis is based on maximum capacity data for another battery of the same type as the battery.

11. The apparatus of claim 8, wherein a load of the battery varies at the two different instances in time.

12. The apparatus of claim 8, wherein operating the plurality of wind turbine generators comprises pitching at least one blade of each of the plurality of wind turbine generators.

13. The apparatus of claim 8, wherein the processor is further configured to:

upon determining the plurality of wind turbine generators are not producing sufficient power output, operate the ESS to discharge the battery.

14. A system comprising:
one or more of wind turbine generators;
at least one battery for storing energy produced by the wind turbine generators; and
at least one processor configured to:
   determine an internal impedance and an electromotive force (EMF) of the battery, wherein the determined internal impedance and the determined EMF are derived from a measured voltage of the battery and a measured current into the battery at two different points in time,
   determine an approximate age of the battery based on the internal impedance,
   determine a relationship between a maximum capacity corresponding to the battery and a number of charging cycles,
   determine an aged capacity of the battery based on the approximate age and the relationship,
   determine a state of charge (SOC) of the battery based on the determined EMF of the battery,
   after determining the aged capacity, measuring an available energy remaining in the battery based on the SOC and the aged capacity, and
   upon determining the available energy remaining in the battery is below a predetermined value, increasing power output of the wind turbine generators by operating the wind turbine generators to produce additional power output in order to improve a rate at which the battery is charged.

15. The system of claim 14, wherein the relationship is based on a regression analysis of the maximum capacity corresponding to the battery.

16. The system of claim 15, wherein the regression analysis is based on maximum capacity data for another battery having functional characteristics similar to the battery.

17. The system of claim 14, wherein a load of the battery varies at the two different points in time.

18. The system of claim 14, wherein operating the wind turbine generators comprises pitching at least one blade of each of the wind turbine generators.

19. The system of claim 14, wherein the processor is further configured to:
   upon determining the wind turbine generators are not producing sufficient power output, discharge the battery.

* * * * *